(12) United States Patent  
Shin (10) Patent No.: US 9,041,045 B2  
(45) Date of Patent: May 26, 2015

(54) TRANSPARENT LED WAFER MODULE AND METHOD FOR MANUFACTURING SAME

(76) Inventor: Sung-Bok Shin, Guri-si (KR)

(*) Notice: Subject to any disclaimer, the term of this patent is extended or adjusted under 35 U.S.C. 154(b) by 131 days.

(21) Appl. No.: 13/583,625

(22) PCT Filed: Feb. 25, 2011

(86) PCT No.: PCT/KR2011/001354  
§ 371 (c)(1),  
(2), (4) Date: Sep. 8, 2012

(87) PCT Pub. No.: WO2011/111937  
PCT Pub. Date: Sep. 15, 2011

(65) Prior Publication Data  
US 2012/0326120 A1    Dec. 27, 2012

(30) Foreign Application Priority Data  
Mar. 9, 2010 (KR) .......... 10-2010-0020997

(51) Int. Cl.  
H01L 33/00  (2010.01)  
H01L 33/40  (2010.01)

(52) U.S. Cl.  
CPC .......... H01L 33/405 (2013.01); H01L 33/0062 (2013.01); *H01L 2933/0016* (2013.01)

(58) Field of Classification Search  
USPC ............ 438/25, 26; 257/E33.008, 79, 80, 81, 257/82, 83, 84, 85, 86, 87, 88, 89, 90, 91, 257/92, 93, 94, 95, 96, 97, 98, 99, 100  
See application file for complete search history.

(56) References Cited

U.S. PATENT DOCUMENTS

| | | | |
|---|---|---|---|
| 5,952,681 A * | 9/1999 | Chen ............................... 257/89 |
| 6,078,064 A * | 6/2000 | Ming-Jiunn et al. .......... 257/103 |
| 6,479,836 B1 * | 11/2002 | Suzuki et al. .................... 257/15 |
| 6,858,882 B2 * | 2/2005 | Tsuda et al. ................... 257/103 |
| 7,335,519 B2 * | 2/2008 | Shei et al. ........................ 438/22 |
| 8,395,165 B2 * | 3/2013 | Chen et al. ...................... 257/79 |
| 2003/0087462 A1 * | 5/2003 | Koide et al. ..................... 438/22 |
| 2005/0001225 A1 * | 1/2005 | Yoshimura et al. ............. 257/98 |
| 2006/0006400 A1 * | 1/2006 | Yoo .................................. 257/94 |
| 2007/0105260 A1 * | 5/2007 | Fudeta ............................. 438/46 |
| 2008/0191220 A1 | 8/2008 | Daniels et al. |
| 2009/0014713 A1 * | 1/2009 | Kang et al. ...................... 257/13 |

FOREIGN PATENT DOCUMENTS

KR   10-2008-0074899 A   8/2008  
KR   10-2009-0013218 A   2/2009

OTHER PUBLICATIONS

International Search Report for PCT Application No. PCT/KR2011/001354.

* cited by examiner

*Primary Examiner* — Matthew W Such  
*Assistant Examiner* — Samuel Lair  
(74) *Attorney, Agent, or Firm* — LRK Patent Law Firm (57) ABSTRACT

A transparent LED wafer module and a method for manufacturing the same are provided. In a conductor LED device epitaxial process, the conductor LED device is grown on a transparent material wafer, where both surfaces of the conductor LED device are entirely grown on the transparent material, and then a transparent glass substrate is restacked, thereby securing a high amount of light.

4 Claims, 6 Drawing Sheets

FIG. 9

TRANSPARENT LED WAFER MODULE AND METHOD FOR MANUFACTURING SAME

TECHNICAL FIELD

The present invention relates to a transparent LED wafer module and a method for manufacturing the same. More particularly, the present invention relates to a transparent LED wafer module and a method for manufacturing the same, in which multiple LED (Light Emitting Diode) epitaxial structures are grown at a predetermined interval to form multiple layered structures on a substrate made of a transparent material, and thus although the amount of current applied to each of the epitaxial structures is very small, it is possible to increase the amount of light by application of a low voltage due to the layered multiple epitaxial structures.

In other words, the present invention relates to a transparent LED wafer module and a method for manufacturing the same, in which since multiple epitaxial structures are provided in a layered structure on a transparent wafer, it is possible to secure a high amount of light. Especially, the present invention relates to a transparent LED wafer module and a method for manufacturing the same, in which a light condenser layer is provided while a high voltage is not applied to each LED device. Unlike a conventional method where a driving voltage of an LED device is increased, the amount of light of the LED module can be secured through layered multiple epitaxial structures provided on a transparent wafer.

BACKGROUND ART

In general, examples of compounds used in manufacturing an LED, which determine a color of the LED include gallium arsenide (GaAs), gallium arsenide phosphide (GaAsP), gallium phosphide (GaP), gallium nitride (GaN), and the like.

Indiumgalliumnitride (InGaN) with a short wavelength is used for manufacturing a blue or green LED. Meanwhile, in the technology for manufacturing a white LED, the term "InGaN" is an acronym derived from several element materials such as indium, gallium and nitrogen.

Then, aluminungailiumarsenide (AlInGaP) with a long wavelength is applied to a red, orange, or yellow spectrum. This technology, called AlInGaP, uses aluminum, indium, gallium, and phosphorous (phosphide).

In general, in AlInGaP (aluminum indiumgallium phosphide), the percentages of Al and In are varied according to various known factors such as a required band gap and lattice matching with a galliumarsenide (GaAs) growth substrate.

Galliumarsenide (GaAs) absorbs visible light. Usually, when a growing process is ended, a gallium-arsenide (GaAs) substrate is removed, and is substituted with a transparent gallium phosphide (0% of Al and In) substrate.

A GaP-based material has a relatively high refractive index (about 3.5).

In such a condition, according to Snell's Law, a ray is reflected inward within an LED when not colliding against the wall surface of the LED within about 17° (critical angle) with respect to a normal line.

There is a problem in that since an LED chip is, in actuality, linear, the reflected light is repeatedly reflected with its incident angle even after several times of reflections, thereby weakening the light of the inside.

Also, in general, multiple LED chips are modularized, and used for various fields as well as lighting. However, this technology requires a complicated operation, process, and has a problem of heat generation per surface area due to an LED characteristic. In other words, due to a structure where the multiple LED chips are concentrated at one spot, high heat generation may be caused, thereby shortening a LED life span.

DETAILED DESCRIPTION OF THE INVENTION

Technical Problem

Therefore, the present invention has been made in view of the above-mentioned problems, and an aspect of the present invention is to provide a transparent LED wafer module and a method for manufacturing the same, in which in an epitaxial process, an LED device is grown on a wafer made of a transparent material, wherein both surfaces of the LEE device are entirely grown on the transparent material, and then a layered structure is formed to secure an amount of light. Further, in the method, it is possible to complete the LED module in the epitaxial process, to reduce process steps, and to secure in actuality a high amount of light.

An object of the present invention is to provide a transparent LED wafer module and a method for manufacturing the same, in which in a LED chip device, multiple epitaxial structures are grown on a transparent glass substrate, wherein firstly, only minimum epitaxial structures are grown so that heat emitted from the epitaxial structures can be radiated on the glass substrate, and then secondly, minimum epitaxial structures are grown on another glass substrate so that the problem of heat radiation can be solved on the glass substrate.

Another object of the present invention is to provide a transparent LED wafer module and a method for manufacturing the same, in which in layering of glass substrates, a space between transparent substrates (in the epitaxial structure, both n- and p-electrodes are on transparent gloss substrate) is formed so that heat emitted from minimum epitaxial, structures on a firstly grown glass substrate cannot be conducted to a secondly grown glass substrate. Further, the heat emitted from each of the epitaxial structures mounted on a plurality of transparent substrates has an effect on only a corresponding glass substrate, and thus it is possible to secure a high amount of light (3601x) through a vertically layered structure of wafers.

Technical Solution

In accordance with an aspect of the present invention, there is provided a transparent LED wafer module including: a lower transparent substrate having translucency; a tower transparent electrode coated on the lower transparent substrate, to which power is applied; a plurality of epitaxial layers layered on the lower transparent electrode, which are spaced at a predetermined interval; a transparent nonconductor which is intervened into the spaces between the epitaxial layers in order to block polarities between an n-electrode and p-electrode formed by the formation of the epitaxial layers; an upper transparent electrode in contact with the p-electrode; and an upper transparent substrate layered on the upper transparent electrode.

In accordance with another aspect of the present invention, there is provided a method for manufacturing a transparent LED wafer module, the method including the steps of: coating a lower transparent electrode on a lower transparent substrate as a bottom; forming epitaxial layers for a transparent electrode; filling a transparent nonconductor so as to block polarities between an n-electrode and p-electrode formed by the formation of the epitaxial layers; and layering an upper transparent electrode on the p-electrode, and an upper transparent substrate on the upper transparent electrode.

Advantageous Effects

In the above described invention, in a semiconductor LEU device epitaxial process, the LED device is grown on a transparent material wafer, wherein both surfaces of the LED device are entirely grown on the transparent material, and then a transparent glass substrate is restacked, thereby securing a high amount of light.

In the present invention, due to growth of multiple epitaxial structures, even though low current is applied to each of epitaxial wafers, multiple chip devices can emit light. Further, through the layered structure, it is possible to increase the amount of light.

In the present invention, since transparent glass materials are used, it is possible to improve the translucent effect. Further, both surfaces of a thick quartz glass substrate are in contact with n and p electrodes, thereby achieving a heat radiation effect.

In other words, although the inventive glass substrate has a heat loss coefficient not higher than a metal, the amount of current applied to one wafer is very small. Thus, a very low amount of heat is generated, and conducted heat can be radiated through a glass substrate coated with a transparent electrode. As a result, it is possible to easily apply a semiconductor LED device to high-current operation.

In the present invention, transparent glass substrates are layered and attached in such a manner that the glass substrates have a gap therebetween. This allows a high luminance led module to be produced. Further, it is possible to complete the LED module in the epitaxial process, to reduce process steps, and to secure in actuality a high amount of light.

In the present invention, multiple epitaxial structures are grown in a horizontal direction on a transparent substrate, and also multiple epitaxial structures are grown and layered in a vertical direction so that a high amount of light can be emitted.

Further, the inventive module has a structure where the volume of a package can be minimized, and molding of an epoxy molding resin on a chip is not required. Thus, it is possible to easily obtain a semiconductor LED device using UV.

MODE FOR CARRYING OUT THE INVENTION

In order to achieve the object, the inventive transparent LED wafer module includes: a lower transparent substrate 100 having translucency;

a lower transparent electrode 200 coated on the lower transparent substrate 100, to which power is applied;

an n-electrode 310 formed after a metal is deposited and etched, in which a lower portion of the n-electrode is received in the lower transparent electrode 200 by a predetermined depth;

an epitaxial layer 300, which includes a plurality of layers, is formed by etching after being deposited on the n-electrode 310, and emits light by application of power;

a p-electrode 370 formed by etching after a metal is deposited on a p-ohmic contact layer 360 as an uppermost layer from among the plurality of layers constituting the epitaxial layer 300;

a transparent nonconductor 600 filled between the lower transparent electrode 200 and an upper transparent electrode 400 connected to the n-electrode 310 and the p-electrode 370, respectively, which blocks positive and negative polarities occurring by power application;

the upper transparent electrode 400 layered on the transparent nonconductor 600 and the p-electrode 370; and an upper transparent substrate 500 having translucency, which is layered on the upper transparent electrode 400.

Terms or words used in the specification and the appended claims should not be construed as having normal or lexical meanings, and should be construed as having meanings and concepts which conform with the spirit of the present invention according to a principle that the inventor can properly define the concepts of the terms in order to describe his own invention in the best way.

Hereinafter, the inventive transparent LED module will be described in detail with reference to accompanying drawings.

Figure 4:
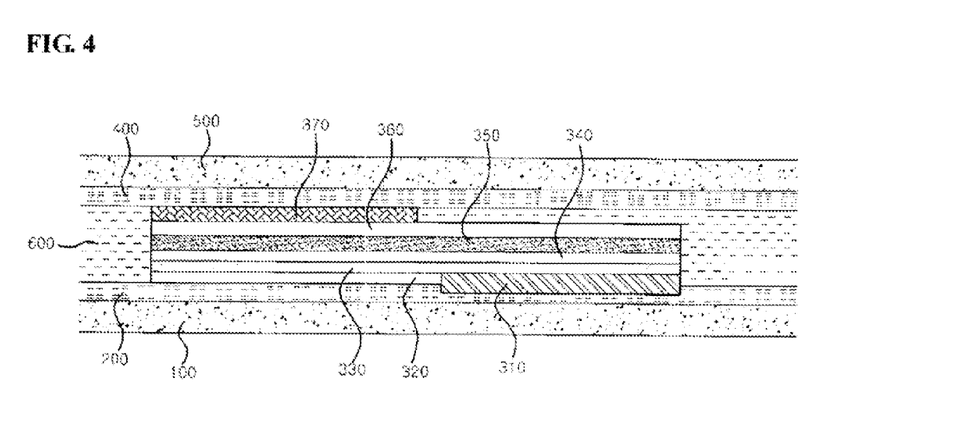
FIG. 4 is a view illustrating the structure of a transparent LED module according to the present invention.

The inventive transparent LED module, shown in FIG. 4, includes a lower transparent substrate 100, a lower transparent electrode 200, an n-electrode 310, a p-electrode 370, an epitaxial layer 300, a transparent nonconductor 600, an upper transparent electrode 400 and an upper transparent substrate 500.

The lower transparent substrate 100 is made of highly translucent quartz glass, and radiates heat generated by light emission.

The lower transparent electrode 200 is also a highly translucent component, and is coated on the lower transparent substrate 100. Herein, the lower transparent electrode 200 has a relatively high resistance, and thus is coated with a large thickness in order to reduce the resistance.

The n-electrode 310 is formed by etching after a metal is deposited on the lower transparent electrode 200, in which the lower portion of the n-electrode 310 is received in the lower transparent electrode 200 by a predetermined depth, and the upper portion of the n-electrode 310 is exposed in such a manner that it can be in contact with an n-AlGaInN layer 330 of the epitaxial layer 300.

The epitaxial layer 300, which includes a plurality of layers, is formed by etching after being deposited on the n-electrode 310, and emits light by application of power.

The p-electrode 370 is formed by etching after a metal is deposited on a p-ohmic contact layer 360 as an uppermost layer from among the plurality of layers constituting the epitaxial layer 300.

The transparent nonconductor 600 is filled between the lower transparent electrode 200 and the upper transparent electrode 400 connected to the n-electrode 310 and the p-electrode 370, respectively, which blocks positive and negative polarities occurring by power application.

The upper transparent electrode 400 is layered in contact with the p-electrode 370 so that applied power can be transferred to the epitaxial layer 300. The upper transparent substrate 500, like the above described lower transparent substrate 200, is made of highly translucent quartz glass, and radiates heat generated by light emission.

Meanwhile, the epitaxial layer 300 includes an AlGaInN buffer 320, the n-AlGaInN layer 330, an AlGaInN active layer 340, a p-AlGaInN clad layer 350 and the p-ohmic contact layer 360.

The AlGaInN buffer 320 is layered by etching after being deposited on one side of the n-electrode 310 at the same height as that of the upper portion of the n-electrode 310, and the lower transparent electrode 200.

The n-AlGaInN layer 330 is layered on the n-electrode 310 and the AlGaInN buffer 320.

The AlGaInN active layer 340 is formed by being layered on the n-AlGaInN layer 330, which emits light by power application.

The p-AlGaInN clad layer 350 is formed by being layered on the AlGaInN active layer 340, and the p-ohmic contact layer 360 is formed by being layered on the AlGaInN active layer 340.

Figure 8:
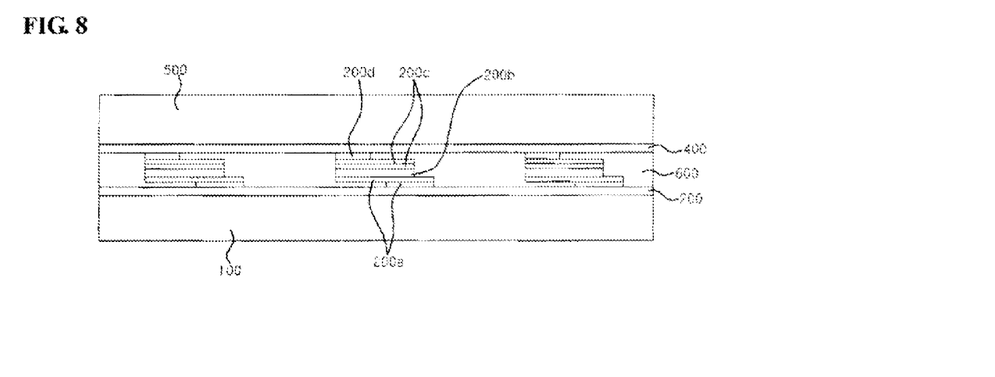
FIGS. 8 and 9 are views illustrating transparent LED modules according to other embodiments of the present invention.

According to another embodiment, instead of the n-electrode 310, an n-AlInGaP layer 200a may be realized, instead of the n-AlGaInN layer 330 of the epitaxial layer 300, the n-AlInGaP layer 200a may be realized, instead of the AlGaInN active layer 340, an AlInGaP active layer 200b may be realized, instead of the p-AlGaInN clad layer 350 and the p-ohmic contact layer 360, a p-AlInGaP layer 200c may be realized, and instead of the p-electrode 370, a p-GaP layer 200d may be realized.

This embodiment as described above is finally for realization of the p-GaP layer 200d. The realization as the p-GaP layer 200d is for improving spreading of current.

Figure 9:
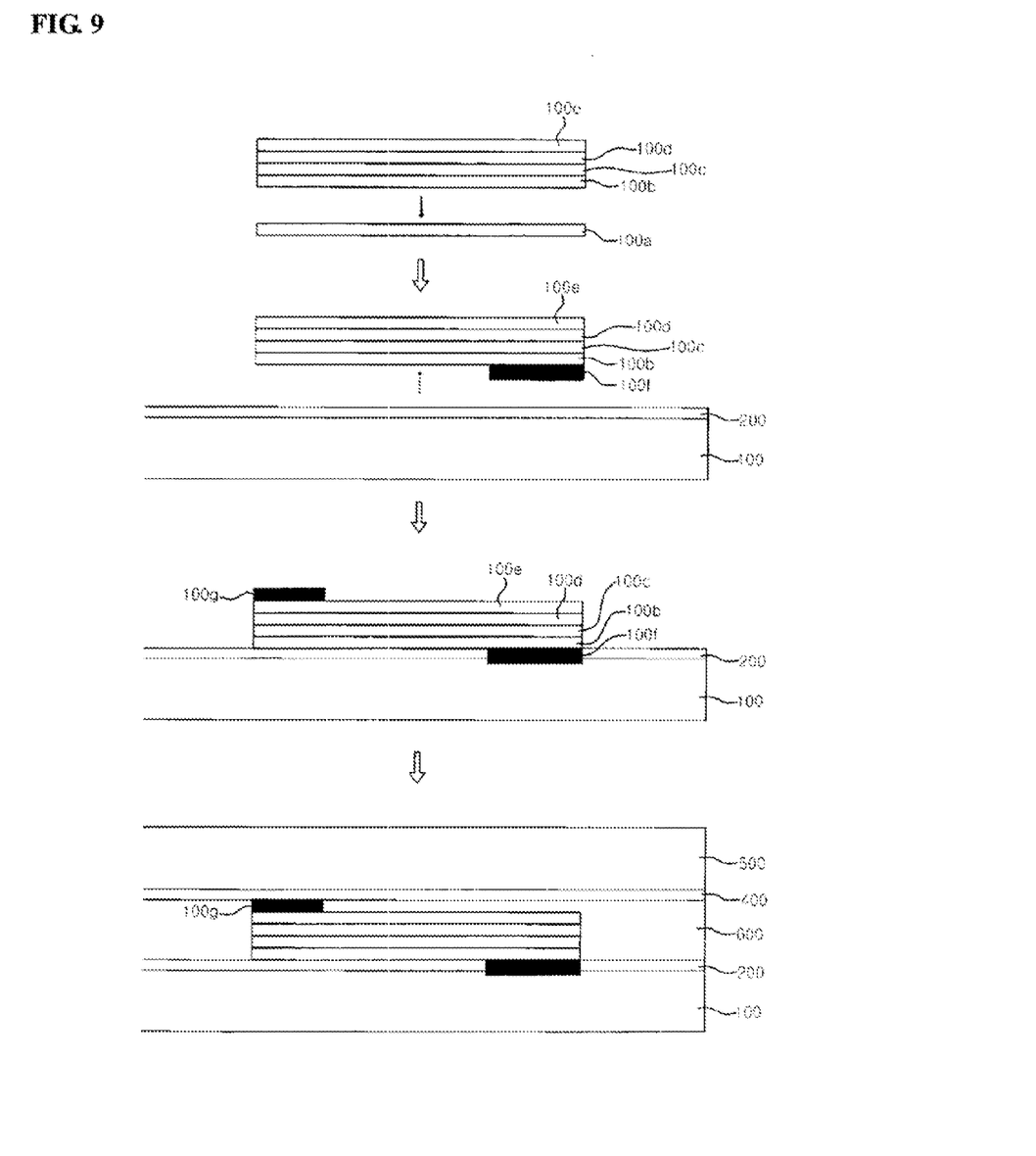

According to a further embodiment, as shown in FIG. 9, on a GaAs substrate 100a, at least one p-AlInGaP clad layer 100b is grown, and on the p-AlInGaP clad layer 100b, an active layer 100c, an n-AlInGaP clad layer 100d and an n-GaP layer 100e as an uppermost layer are grown.

Herein, the light emitted from the active layer 100c is directly emitted through the p-AlInGaP clad layer 100b and the n-GaP layer 100e, or emitted after reflecting from at least one of inner surfaces of an LED die.

The p-AlInGaP clad layer 100b is formed so that the light can escape through the uppermost portion.

The GaAs substrate 100a in contact with the p-AlInGaP clad layer 100b is removed while the p-AlInGaP clad layer 100b is formed with a metal electrical contact 100f.

Then, on a lower transparent glass substrate 100 coated with a lower transparent electrode 200, an LED die in which the p-AlInGaP clad layer 100b, the active layer 100c, the n-AlInGaP clad layer 100d and the n-GaP layer 100e as an uppermost layer are layered is mounted.

Then, the n-GaP layer 100e as the uppermost layer is formed with a metal electrical contact 100g, and then a transparent nonconductor 600 having a window is filled. Finally, an upper transparent electrode 400 is mounted, and then an upper transparent substrate 500 is mounted.

Hereinafter, the inventive method for manufacturing a transparent LED module will be described in detail with reference to accompanying drawings.

Figure 1:
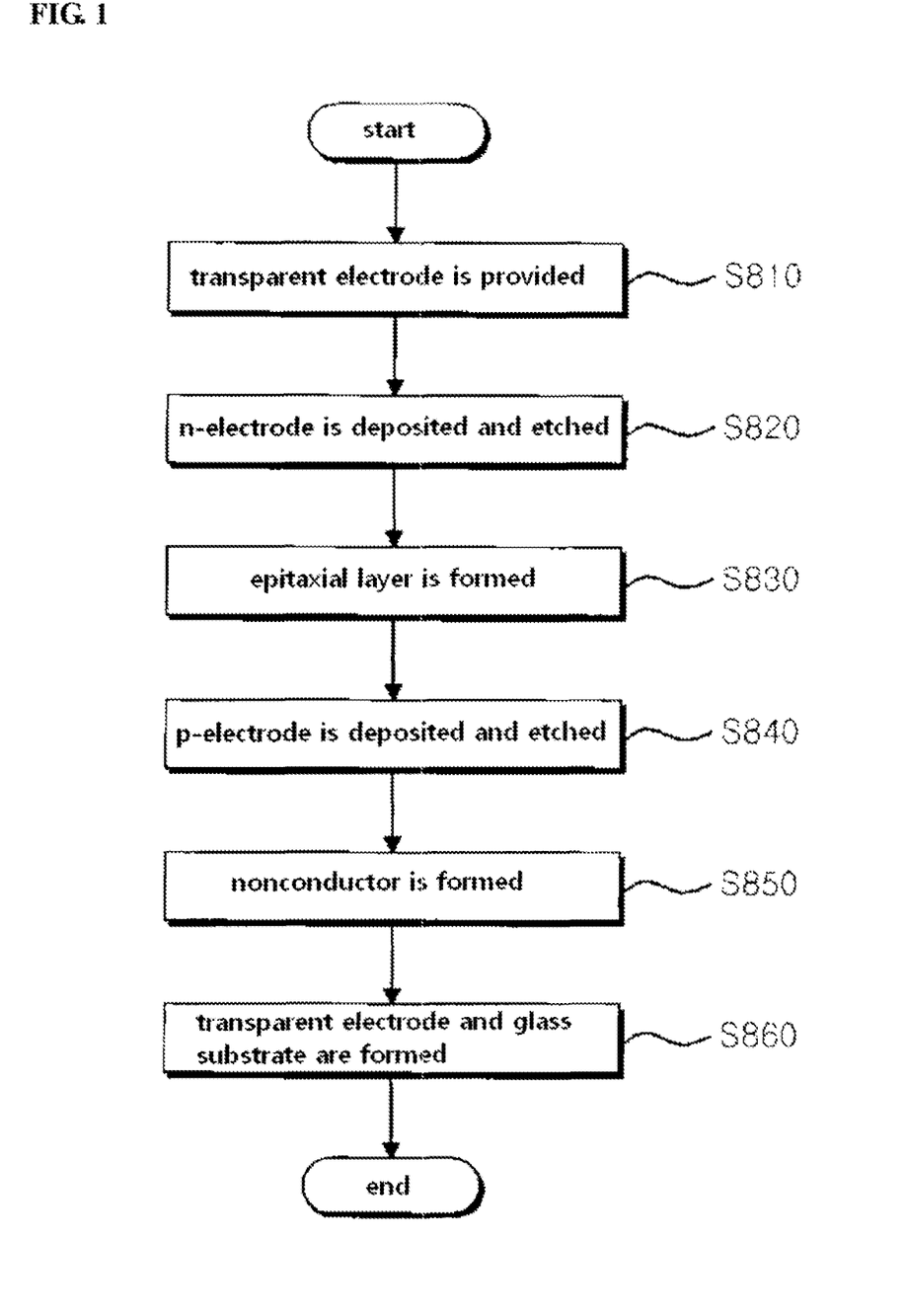
FIG. 1 is a flow chart illustrating a method for manufacturing a transparent LED module according to the present invention.
Figure 2:
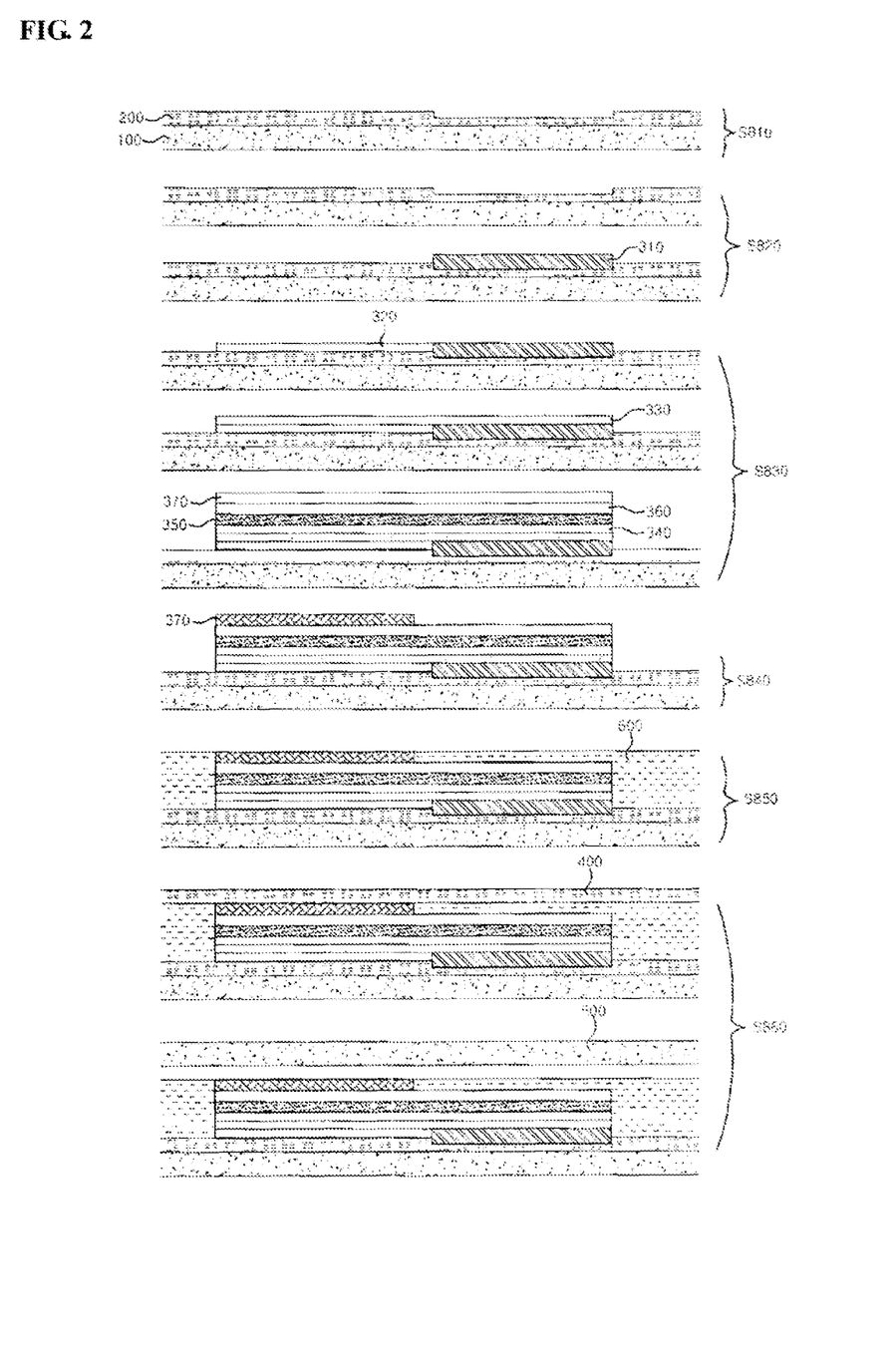
FIG. 2 is a view illustrating a process of forming a transparent LED module.

FIG. 1 is a flow chart illustrating a method for manufacturing a transparent LED module according to the present invention, and FIG. 2 is a view illustrating a process of forming the transparent LED module.

A translucent transparent, substrate 100 with a predetermined area, which is made of quartz glass and thus is light transmissive, is coated with a lower transparent electrode 200 in step S810.

On the lower transparent electrode 200 coated in step S810, a metal is deposited and etched so as to form an n-electrode 310 in step S820.

In step S820, the lower portion of the n-electrode 310 is deposited and etched in such a manner that it can be received in the lower transparent electrode 200 by a predetermined depth, and the upper portion of the n-electrode 310 is exposed in such a manner that it can be in contact with an n-AlGaInN layer 330 of an epitaxial layer 300 to be described later.

After step S820, the epitaxial layer 300 including a plurality of layers is formed by a deposition and etching process in step S830.

On a p-ohmic contact layer 360 of the epitaxial layer 300 formed in step S830, a metal is deposited and etched to form a p-electrode 370 in step S840 in the same process for forming the n-electrode 310 in S820.

In order to block positive and negative polarities occurring between the n-electrode 310 and the p-electrode 370 formed in steps S820 and S840, respectively by power application, a transparent nonconductor 600 is filled between the lower transparent electrode 200 and an upper transparent electrode 400 connected to the n-electrode 310 and the p-electrode 370, respectively, in step S850.

On the p-electrode that has been formed by deposition and etching, as described above in step S840, the upper transparent electrode 400 is layered, and then, an upper transparent substrate 500 is grown thereon in step S860.

In consideration of light transmittance and heat radiation, the lower transparent substrate 100 and the upper transparent substrate 500 are coated with the lower transparent electrode 200 and the upper transparent electrode 400, respectively. Herein, the lower transparent electrode 200 and the upper transparent electrode 400 coated on the transparent substrate 100 and the upper transparent substrate 500 have a relatively high resistance, and thus are coated with a large thickness in order to reduce the resistance.

Meanwhile, the formation of the epitaxial layer as described above in step S820 will be described in more detail with reference to FIG. 3.

Figure 3:
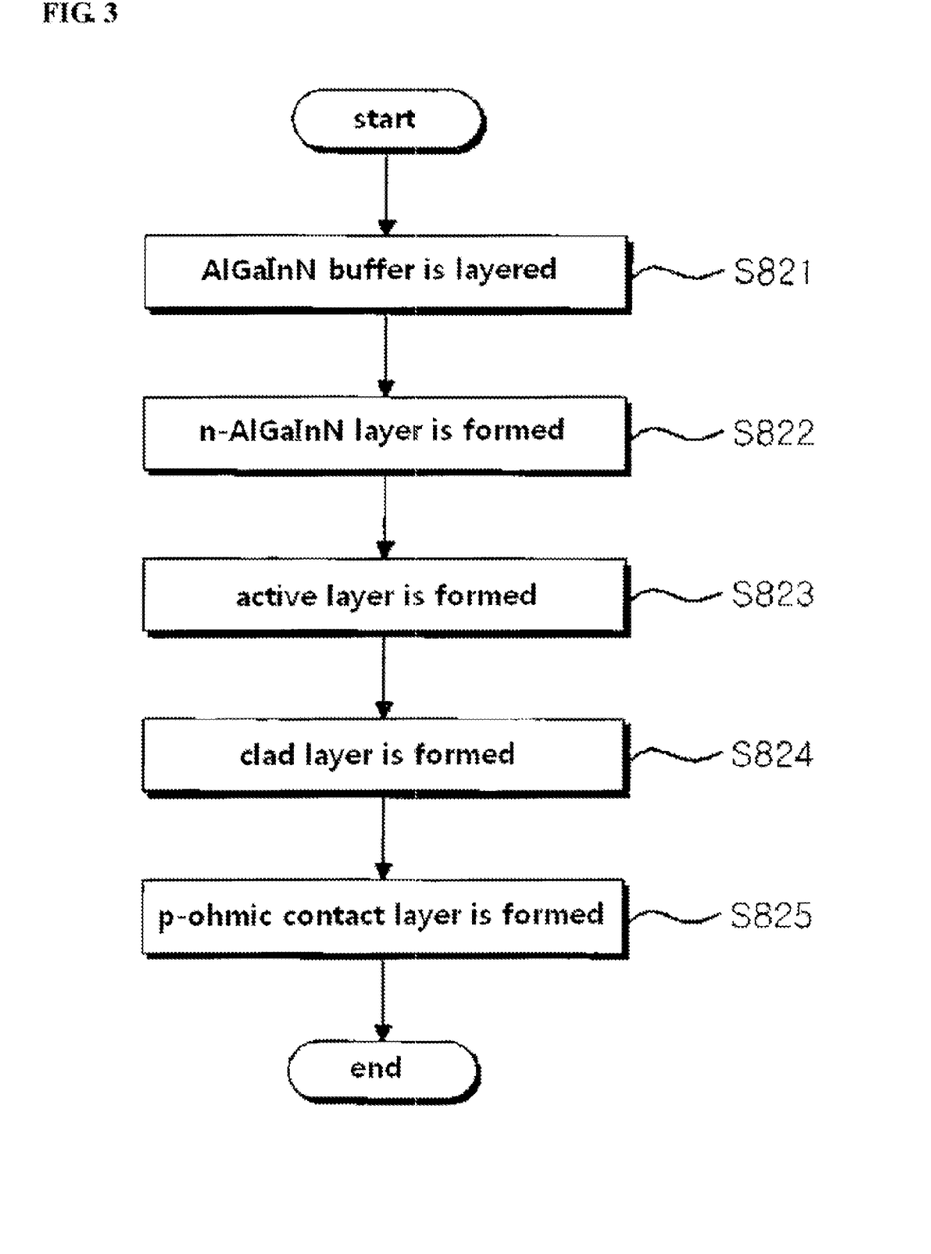
FIG. 3 is a flow chart specifically illustrating the step of forming an epitaxial layer, according to the present invention.

FIG. 3 is a flow chart specifically illustrating the step of forming an epitaxial layer, according to the present invention.

In other words, in the above described step of S830 (S821), an AlGaInN buffer 320 of 5 nm to 500 nm is grown through MOCVD (metal organic chemical vapor deposition) and etched at one side of the n-electrode 310 at the same height as that of the exposed upper portion of the n-electrode 310 which has been formed by deposition and etching on the lower transparent electrode 200 coated on the lower transparent substrate 100 in step S820.

After step S821, on the n-electrode 310 and the AlGaInN buffer 320, an n-AlGaInN layer 330 of 1 um to 10 um is layered through a deposition and etching process using MOCVD (metal organic chemical vapor deposition) in step S822. On the n-AlGaInN layer 330, an AlGaInN active layer 340 including a plurality of quantum wells, which emits light by power application through the n-electrode 310 and the p-electrode 370 formed in the above described steps S820 and S340 respectively, is layered in step S823.

In step S824, on the AlGaInN active layer 340, a p-AlGaInN clad layer 350 of 5 nm to 500 nm is layered through MOCVD (metal organic chemical vapor deposition), and on the p-AlGaInN clad layer 350, the p-ohmic contact layer 360 of 5 nm to 500 nm is layered through MOCVD (metal organic chemical vapor deposition) in step S825.

For reference, in the above described process using the upper and lower glass substrates 100 and 500, multiple epitaxial structures are deposited on a substrate divided into individual modules having a predetermined area.

Herein, the n-electrode 310 and the p-electrode 370 are layered in such a manner that they can be in contact with the lapped surface and the polished surface of the lower transparent electrode 200 and the upper transparent electrode 400, respectively.

In the transparent LED wafer module manufactured as described above, when current is supplied to the upper/lower transparent electrodes 400 and 200, the light emitted from the active layer 340 is directly emitted to both surfaces through the upper/lower transparent glass substrate 500 and 100.

For reference, the above described upper/lower transparent substrates 100 and 500 have a predetermined area through a sawing process after the whole process is completed.

Figure 5:
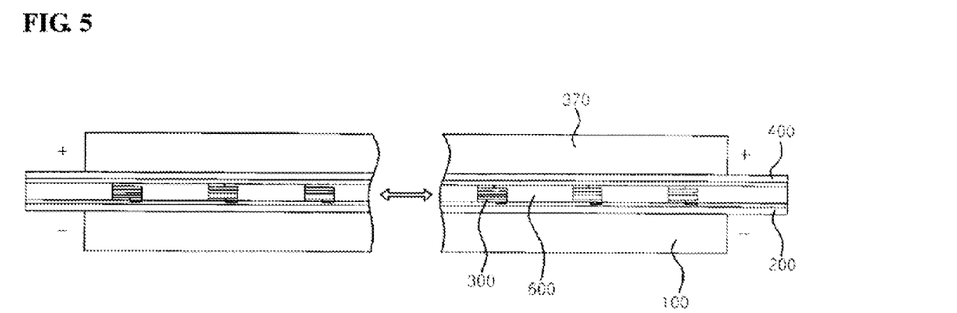
FIG. 5 is a view illustrating an epitaxial layer of a transparent LED wafer module according to the present invention, which is formed in plural numbers in a horizontal direction.
Figure 6:
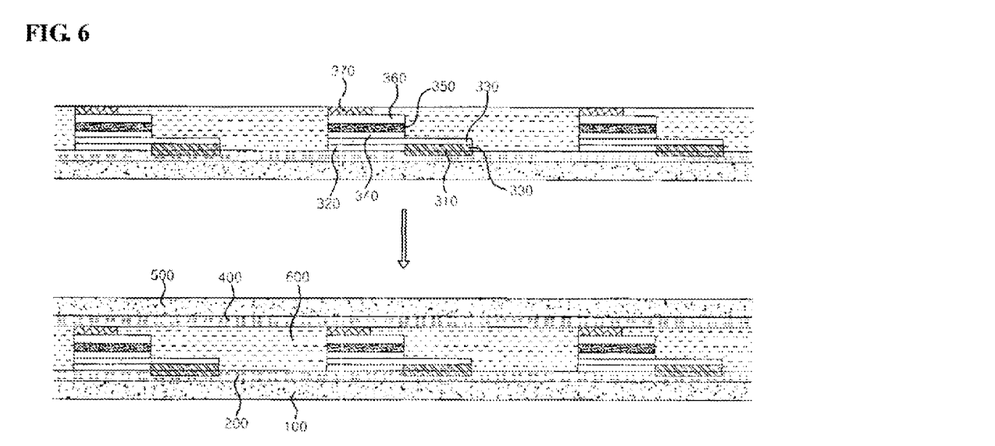
FIG. 6 is a view illustrating transparent LED wafer modules having a plurality of epitaxial layers formed therein, which are layered in a vertical direction.

Meanwhile, as shown in FIG. 5 illustrating an epitaxial layer of a transparent LED wafer module according to the present invention, which is formed in plural numbers in a horizontal direction, and FIG. 6 illustrating transparent LED wafer modules having a plurality of epitaxial layers formed therein, which are layered in a vertical direction, the above described plurality of epitaxial layers 300 may be grown in a horizontal direction on the glass substrate 100 coated with the transparent electrode 200, and grown in a vertical direction in a layered structure. When current is supplied, the light emitted from the epitaxial active layers 340 grown in the layered structure is emitted through the glass substrates 100 and 500.

Figure 7:
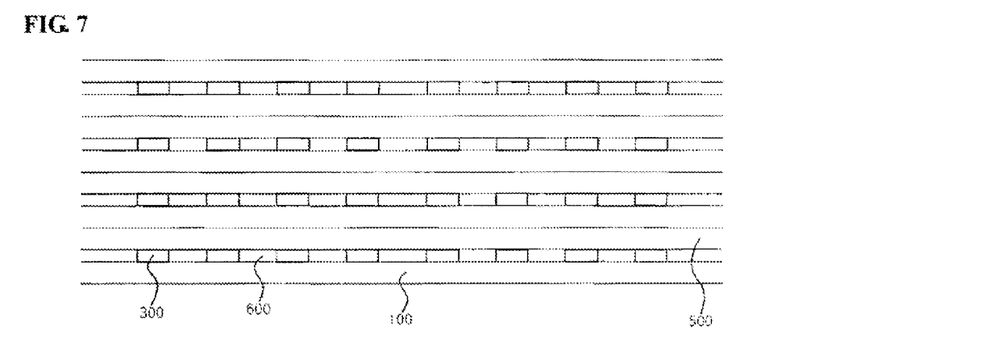
FIG. 7 is a view illustrating a plurality of epitaxial layers, according to the present invention, which are arranged in rows and columns in a cross direction and a longitudinal direction.

As described above, the epitaxial layers 300 are formed in a horizontal direction and a vertical direction. Then, as shown in FIG. 7, when the plurality of epitaxial layers 300 are arranged in rows and columns in a cross direction and a longitudinal direction, it is possible to secure a high amount of light from the active layers 340 included in the epitaxial layers 300, the active layers 340 emitting light by application of supplied current. Herein, heat emitted the plurality of epitaxial layers 300 is absorbed and radiated by the upper/lower glass substrates 100.

According to another embodiment, as shown in FIG. 8, instead of the n-electrode 310 and the n-AlGaInN layer, an n-AlInGaP layer 200a with a thickness of 1.5 microns may be grown, instead of the active layer, an AlInGaP active layer 200b with a thickness of 0.5 microns may be grown, instead of the p-electrode and the clad layer, a p-AlInGaP layer 200c with a thickness of 1.0 micron may be grown on the AlInGaP active layer 200b, and instead of the p-electrode, a p-GaP layer 200d with a thickness of 30 microns may be grown, through VPE (vapor-phase epitaxy), LPE (liquid phase epitaxy), or MBE (molecular beam epitaxy).

Especially, the p-GaP layer is grown with a relatively large thickness in order to improve the spreading of current.

The growths of all of the above described layers are performed by MOCVD (metal organic chemical vapor deposition).

Each layer, called a confining layer or a clad layer, is designed to reduce stress, change a band gap, and spread current.

According to a further embodiment, as shown in FIG. 9, on a GaAs substrate 100a, at least one p-AlInGaP clad layer 100b is grown, and on the p-AlInGaP clad layer 100b, an active layer 100c, an n-AlInGaP clad layer 100d and an n-GaP layer 100e as an uppermost layer are grown.

Herein, the light emitted from the active layer 100c is directly emitted through the p-AlInGaP clad layer 100b and the n-GaP layer 100e, or emitted after reflecting from at least one of inner surfaces of an LED die.

The p-AlInGaP clad layer 100b is formed so that, the light can escape through the uppermost portion.

The GaAs substrate 100a in contact with the p-AlInGaP clad layer 100b is removed while the p-AlInGaP clad layer 100b is formed with a metal electrical contact 100f.

Then, on a lower transparent glass substrate 100 coated with a lower transparent electrode 200, an LED die in which the p-AlInGaP clad layer 100b, the active layer 100c, the n-AlInGaP clad layer 100d and the n-GaP layer 100e as an uppermost layer are layered is mounted.

Then, the n-GaP layer 100e as the uppermost layer is formed with a metal electrical contact 100g, and then a transparent nonconductor 600 having a window is filled. Finally, an upper transparent electrode 400 is mounted, and then an upper transparent substrate 500 is mounted.

The metal electrical contact 100g on the n-GaP layer 100e may allow light to be emitted and appropriately provide current spread to the active layer 100c, in a different manner. The upper/lower transparent electrodes 200 and 400 are connected to a power source for an LED die, and supply applied power to an LED chip. Herein, the current amount depends on how much current can be supplied to the specific surface area of the contact portion between the upper/lower transparent electrodes 200 and 400 and the chip.

For example, in the case of 1 mA of a current amount, it is possible to obtain a minimum chip size, and to know a specific surface area (the chip is slightly impregnated). Herein, a corresponding current amount can be calculated. Then, when the current is insufficient, a current amount of less than 1 mA is set, and when the current is sufficient, a current amount of greater than 1 mA is set.

Then, a chip interval is calculated by setting a light source brightness and a size of a final product, and dividing the brightness by the number of chips.

In other words, when 5-fold back lights for satisfying a strong light source required for a beam projector are configured, the number of chips can be determined by multiplying a back light aperture area by 5, and dividing the multiplied value by the chip interval.

Although the specific embodiments of the present invention has been disclosed for illustrative purposes, those skilled in the art will appreciate that various modifications, and changes are possible without departing from the scope of the invention as disclosed in the accompanying claims.

INDUSTRIAL APPLICABILITY

Disclosed are a transparent LED wafer module and a method for manufacturing the same. In a conductor LED device epitaxial process, the conductor LED device is grown on a transparent material wafer, wherein both surfaces of the conductor LED device are entirely grown on the transparent material, and then a transparent glass substrate is restacked, thereby securing a high amount of light.

The invention claimed is:
1. A transparent LED wafer module comprising:
a lower transparent substrate having translucency;
a lower transparent electrode coated on the lower transparent substrate, to which power is applied;

an n-electrode formed after a metal is deposited and etched, in which a lower portion of the n-electrode is received in the lower transparent electrode by a predetermined depth;

an epitaxial layer comprising a plurality of layers, which is formed by etching after being deposited on the n-electrode, and emits light by application of power;

a p-electrode formed by etching after a metal is deposited on a p-ohmic contact layer as an uppermost layer from among the plurality of layers constituting the epitaxial layer;

a transparent nonconductor filled between the lower transparent electrode and an upper transparent electrode connected to the n-electrode and the p-electrode, respectively, which blocks positive and negative polarities occurring by power application; wherein the upper transparent electrode is layered on the transparent nonconductor and the p-electrode; and an upper transparent substrate having translucency, which is layered on the upper transparent electrode, wherein the epitaxial layer comprises:

an AlGaInN <aluminum-gallium-indium-nitride> buffer formed by etching after being deposited on the lower transparent electrode, which is grown on one side of the n-electrode at the same height as that of an upper portion of the n-electrode;

an n-AlGaInN layer layered on the n-electrode and the AlGaInN buffer;

an AlGaInN active layer layered on the n-AlGaInN layer, which comprises a plurality of quantum wells, and emits light by power application;

a p-AlGaInN clad layer layered on the AlGaInN active layer; and a p-ohmic contact layer layered on the p-AlGaInN clad layer.

2. The transparent LED wafer module as claimed in claim 1, wherein when power is applied through the upper transparent electrode and the transparent electrode, heat generated from the AlGaInN active layer is radiated through the upper transparent substrate and the lower transparent substrate.

3. A method for manufacturing a transparent LED wafer module, the method comprising the steps of:

(a) coating a lower transparent electrode on a lower transparent substrate having translucency;

(b) forming an n-electrode by depositing and etching a metal on the lower transparent electrode coated in step (a);

(c) forming an epitaxial layer by being deposited and etched on then-electrode, the epitaxial layer comprising a plurality of layers, and emitting light by power application;

(d) forming a p-electrode by depositing and etching a metal on a p-ohmic contact layer formed as an uppermost layer of the epitaxial layer;

(e) filling a transparent nonconductor between the lower transparent electrode and an upper transparent electrode connected to the n-electrode and the p-electrode, respectively, formed in steps (b) and (d) in order to block positive and negative polarities occurring by power application; and (f) layering the upper transparent electrode on the p-electrode and the transparent nonconductor, and layering an upper transparent substrate on the upper transparent electrode, wherein the step (c) comprises the steps of:

(c-1) growing an AlGaInN buffer by depositing and etching the AlGaInN buffer at one side of the n-electrode at the same height as that of an exposed upper portion of the n-electrode formed in the step (b);

(c-2) layering an n-AlGaInN layer on the n-electrode and the AlGaInN buffer through a deposition and etching process, and layering an AlGaInN active layer on the n-AlGaInN layer, the AlGaInN active layer comprising a plurality of quantum wells, and emitting light by power application through the lower transparent electrode and the upper transparent electrode formed respectively in the steps (a) and (f); and (c-3) layering a p-AlGaInN clad layer on the AlGaInN active layer, and layering a p-ohmic contact layer.

4. The method as claimed in claim 3, wherein when power is applied through the upper transparent electrode and the transparent electrode, heat generated from the AlGaInN active layer is radiated through the upper transparent substrate and the lower transparent substrate.

* * * * *